Figure 1:
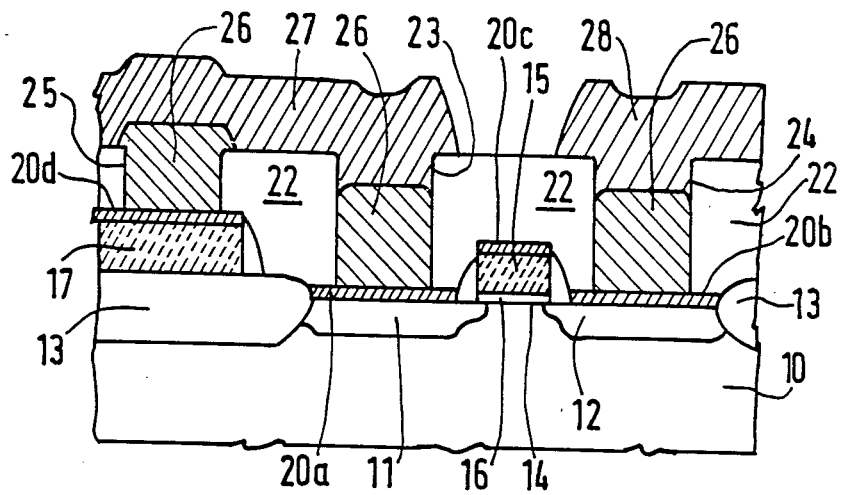

United States Patent [19]

Ellwanger et al.

[11] Patent Number: 4,851,369

[45] Date of Patent: Jul. 25, 1989

[54] METHOD OF ESTABLISHING A STRUCTURE OF ELECTRICAL INTERCONNECTIONS ON A SILICON SEMICONDUCTOR DEVICE

[75] Inventors: Russell C. Ellwanger; Johannes E. J. Schmitz, both of Eindhoven, Netherlands

[73] Assignee: U.S. Philips Corporation, New York, N.Y.

[21] Appl. No.: 268,149

[22] Filed: Nov. 7, 1988

[30] Foreign Application Priority Data

Dec. 4, 1987 [FR] France ............................. 87 16873

[51] Int. Cl.⁴ ................... H01L 21/00; H01L 21/02; H01L 21/283; H01L 21/441
[52] U.S. Cl. .................................. 437/200; 437/189; 437/192; 437/202; 148/DIG. 19
[58] Field of Search ............... 437/189, 192, 194, 200, 437/202, 984; 148/DIG. 19, DIG. 20, DIG. 147

[56] References Cited

U.S. PATENT DOCUMENTS

| 4,107,726 | 8/1978 | Schilling ............................... 357/65 |
| 4,121,241 | 10/1978 | Drake et al. ......................... 357/65 |
| 4,507,852 | 4/1985 | Karulkar ............................. 437/195 |
| 4,545,116 | 10/1985 | Lau ..................................... 437/196 |
| 4,562,640 | 1/1986 | Widmann et al. .......... 148/DIG. 19 |
| 4,641,420 | 2/1987 | Lee .............................. 148/DIG. 19 |
| 4,672,419 | 6/1987 | McDavid ........................... 357/23.9 |
| 4,690,730 | 9/1987 | Tang et al. ........................... 156/643 |
| 4,804,636 | 2/1989 | Groover, III et al. ............... 437/52 |

FOREIGN PATENT DOCUMENTS

| 0068897 | 1/1983 | European Pat. Off. ............ 437/202 |
| 0104079 | 3/1984 | European Pat. Off. ............ 437/192 |
| 0211318 | 2/1987 | European Pat. Off. ............ 437/192 |
| 0267730 | 5/1988 | European Pat. Off. ............ 437/192 |
| 3301666 | 7/1984 | Fed. Rep. of Germany ...... 437/192 |
| 3625860 | 2/1987 | Fed. Rep. of Germany ...... 437/192 |
| 3534600 | 4/1987 | Fed. Rep. of Germany ...... 437/192 |
| 3632217 | 4/1987 | Fed. Rep. of Germany ...... 437/192 |
| 57-013753 | 1/1982 | Japan . |
| 57-114274 | 7/1982 | Japan . |
| 60-245256 | 12/1985 | Japan . |
| 2083949 | 3/1982 | United Kingdom ................ 437/200 |
| 2168841 | 6/1986 | United Kingdom ....... 148/DIG. 19 |
| 2181893 | 4/1987 | United Kingdom ................ 437/192 |
| 8801102 | 2/1988 | World Int. Prop. O. .......... 437/192 |

OTHER PUBLICATIONS

Broadbent, E., Growth of Selective Tungsten on Self-Aligned Ti and PtNi Silicides by Low Pres. Chem. Vapor Deposition, J. Electrochem. Soc., pp. 1715–1720, vol. 133, No. 8, Aug. 1986.

Kaneko, H., Novel Submicron MOS Devices by Self-Aligned Nitridation of Silicide, pp. 208–211, IEDM 85.

Lin, M., A New Lateral Growth Free Formation Technique for Titanium Silicide Using the Si/W/Ti Trilayer Structure, J. Electrochem. Soc., pp. 2342–2346, vol. 135, No. 9, Sep. 1988.

Primary Examiner—Brian E. Hearn
Assistant Examiner—B. Everhart
Attorney, Agent, or Firm—Paul R. Miller

[57] ABSTRACT

After having formed contact islands (20) comprising at least one layer of silicide (20) of titanium or cobalt, these islands are covered by a complementary metallic layer (30) obtained by selective growth of tungsten or molybdenum, which is localized at the said islands. This complementary metallic layer especially serves as a stopping layer during etching of contact openings (33) into an isolating layer (32) supporting the remaining part of the structure of interconnections.

6 Claims, 2 Drawing Sheets

METHOD OF ESTABLISHING A STRUCTURE OF ELECTRICAL INTERCONNECTIONS ON A SILICON SEMICONDUCTOR DEVICE

The present invention relates to a method of manufacturing a structure of electrical interconnections on a semiconductor device having a silicon substrate, this method comprising especially the following successive steps:

producing contact zones at the surface of the semiconductor device, forming contact islands comprising at least one layer of silicide of a refractory metal, such as titanium or cobalt, covering the contact zones, forming on the assembly an isolating layer, in which contact openings are provided, in which at least parts of the surface of the contact islands are exposed, obtaining a metallic configuration of interconnections by first carrying out a step of at least partially filling the contact openings by localized elements of a refractory metal, such as tungsten or molybdenum, and by then covering the assembly with a metallic layer, which is then cut into a given configuration, parts of this metallic configuration covering the contact openings and being in electrical contact with the localized elements.

Semiconductor devices and especially integrated circuits are currently manufactured by utilizing aluminium or an alloy of aluminium as material for the contact connection with the surface of silicon and for establishing the structure of interconnections. However, a constant tendency of the technique becomes manifest in favour of an increase of the complexity of the integrated functions and their speed of operation, which results in giving to the constitutive elements of these functions increasingly smaller dimensions.

In this context, it has been found that aluminum suffered from serious limitations of use with respect to given methods of manufacturing circuits having a very high integration density, at least with regard to the contact connection on doped zones of the semiconductor having a very shallow depth and reduced lateral dimensions.

Therefore, a contact connection technique using a silicide of a refractory metal, for example titanium silicide, as material for the contact connection at the surface of the semiconductor, is now preferred in the field of very large scale integration, especially due to the fact that this technique permits producing contact islands self-aligned with the contact zones provided at the surface of the devices and in the case of MOS transistors also self-aligned with the gates of silicon, if this is desired, With regard to the formation of the configurations of interconnections of levels higher than the first level, endeavours are continuously made to determine, which are the most suitable techniques, especially with a view to forming electrical (vertical) connections between the different levels of interconnections, whose dimensions are of the order of 1 $/\mu$ in diameter or less. In fact, such a reduction of the dimensions is desirable to attain the very high integration densities aimed at. In this respect, a great difficulty is due to the fact that the contact openings in the isolating separation layer are comparatively deep with respect to their diameter (ratio depth/diameter approximately equal to 1 or higher) and that the conventional metallization techniques can no longer be used to fill suitably contact openings having such a geometry.

Among the envisaged methods to solve this difficulty, there has been suggested to realize the metallic configuration of interconnections in two steps, a first step having for its object to fill at least substantially the contact openings with localized elements of a refractory metal, i.e. tungsten or molybdenum, obtained, for example, by selective growth or by a uniformly covering deposition followed by a partial etching, and a second step consisting simply in covering the structure with a metallic layer and cutting out of it the desired configuration.

Test results relative to several contact connection methods and especially with regard to the use of the method mentioned in the opening paragraph are published in an article entitled: "The contact properties to TiSi$_2$ and the adhesion within submicron contact holes of etched-back CVD W/adhesion layer films", by R. C. Ellwanger, J. E. Schmitz, R. A. Wolters and A. J. van Dijk, "Proceeding of the workshop on tungsten and other refractory metals for VLSI applications" II, 1986.

In the method concerned, the operation consisting in providing the contact openings in the isolating layer is fairly critical.

In fact, the etched stopper in the bottom of the openings is constituted by the silicide layer, whose etching selectivity with respect to the oxide of the isolating layer is not very high. Therefore, there is a risk that the silicide layer is damaged during etching of the contact openings.

The present invention especially has for its object to obviate this difficulty and to provide a method, in which the operation of etching the contact openings is less critical and preserves the integrity of the layer of silicide in contact with the semiconductor material.

To this end, according to the invention, a method of manufacturing a structure of electrical interconnections on a semiconductor device having a silicon substrate, which method especially comprises the following successive steps:

producing contact zones at the surface of the device, forming contact islands comprising at least one layer of silicide of a refractory metal, such as titanium or cobalt covering the contact zones, forming on the assembly an isolating layer, in which contact openings are provided, in which at least portions of the contact islands are exposed, obtaining a metallic configuration of interconnections by first carrying out a step of at least partially filling the contact openings with localized elements of a refractory metal, such as tungsten or molybdenum, and by then covering the assembly with a metallic layer, which is subsequently cut into the given configuration, parts of this metallic configuration covering the contact openings and being in electrical contact with the said localized elements, is characterized in that, before the isolating layer is formed, the contact islands are covered by a complementary metallic layer obtained by selective growth of tungsten or molybdenum, which is localized at the said islands.

Thus, during the step of etching the contact openings into the isolating layer, the depth of the etching to be obtained is limited by the complementary metallic layer. Now, the etching selectivity of the isolating material—for example silicon dioxide—with respect to tungsten or molybdenum is excellent so that the operation of etching can be prolonged without fear for a substantial attack of the complementary metallic layer in the bottom of these openings. This method permits providing in a very reliable manner contact openings, which on the same substrate have different depth limits, as results from a so-called operation of planarization of the isolating layer.

On the other hand, since the complementary metallic layer is obtained directly in a localized form, it does not require the use of a particular etching mask. It should also be noticed that complementary metallic layer has a function which does not impose a rigorous control of its thickness.

Finally, the structure formed by the association of the complementary metallic layer and of the localized elements of refractory metal has because of its shape a higher mechanical resistance to stresses and especially thermal stresses.

In practice, the thickness of the complementary metallic layer is chosen to lie between 20 and 150 nm and preferably between 50 and 100 nm.

In the first particular embodiment the method according to the invention is characterized in that, when titanium is chosen as refractory metal for the formation of the said layer of silicide, at its surface a layer of titanium nitride is formed, which is used as a base for the selective growth of the complementary metallic layer.

Preferably, this titanium nitride layer is formed by a conversion treatment at the surface of the titanium silicide layer at a temperature lying between 700 and 1000° C. in a nitrogen atmosphere. Thus, a base is formed suitable for the growth of the complementary metallic layer by means of the thermal treatment, which at the same time serves to sinter the layer of titanium silicide.

According to this embodiment, the complementary metallic layer is preferably formed by the method of chemical deposition from the vapour phase at a reduced pressure lying between 0.05 and 2 torr (6.6 to 266 Pa) utilizing the reduction by hydrogen of tungsten hexafluoride (or molybdenum hexafluoride) at a temperature lying between 300 and 500° C. and a gas flow-rate ratio of hexafluoride/hydrogen lying between 1/1000 and 1/5.

In a second particular embodiment of the invention, the protection of the layer of titanium silicide by a layer of titanium nitride before the deposition of the complementary metallic layer is no longer necessary.

It is characterized in that in the method of chemical reaction from the vapour phase (LPCVD) just mentioned, moreover a flow-rate of silane ($SiH_4$) is introduced, whose value with respect to the flow-rate of tungsten hexafluoride (or molybdenum hexafluoride) lies between 1/5 and 3/1.

The following description with reference to the accompanying drawings, given by way of non-limitative example, will make clearly understood how the invention can be realized.

FIG. 1 is a diagrammatic and partial sectional view of a structure of interconnections of an integrated circuit susceptible to being obtained by the method according to the invention, FIGS. 2, 3, 4, 5A, 5B, 5C, and 6 illustrate by partial elevations in sectional view different stages of the method according to the invention for the connection of electrical contacts on a semiconductor device.

FIG. 1 indicates an example of a structure of interconnections establishing the connection of electrical contacts in a silicon integrated circuit having MOS transistors. A substrate 10 of a first conductive type carries at its surface doped source and drain regions 11, 12 of a second conductivity type opposite to the first type. These doped regions 11 and 12 have a periphery limited by a localized layer of field oxide 13 and are mutually separated by a narrow channel 14 on which is disposed a control gate 15 of highly doped polycrystalline silicon. The gate 15 is insulated from the semi-conductor material of the channel 14 by agate oxide layer 16.

Portions of the layer of polycrystalline silicon having served to form the gate 15 can be maintained above the field oxide 13 to establish certain electrical connections; an example is the connection strip represented at 17. At the surface of the device under formation have been realized contact zones which expose the major part of the surface of the doped regions 11 and 12 and the surface of the gates 15 and of the connection strips 17. Subsequently, contact islands 20a to 20d have been formed comprising at least one layer of silicide of a refractory metal, such as titanium or cobalt, and which have been obtained by self-alignment with the contact zones by means of a technique well known to those skilled in the art.

An isolating layer 22 has contact openings 23,24,25, whose bottom merges at given contact islands 20a,20b20d.

Finally, a configuration of interconnections complete the structure of the device shown, this configuration comprising on the one hand the localized elements 26 of tungsten or molybdenum filling at least in part the contact openings 23,24,25 and on the other hand portions 27,28 of a metallic layer of the so-called second level, which may be made, for example, of aluminium, cut into a given configuration and which covers the localized elements 26 so as to establish the desired electrical connections with the contact islands 20a,20b,20d.

As will be described hereinafter, the method according to the invention has for its object to provide a structure of interconnections, especially of the type shown diagrammatically in FIG. 1, in which, before the isolating layer 22 is formed, the contact islands 20a,20b,20c,20d are covered by a complementary metallic layer obtained by selective growth of tungsten or molybdenum and therefore located at the islands.

Figure 2:
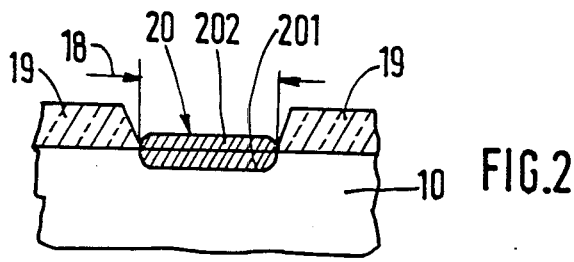

The method according to the invention is described with reference to FIGS. 2 to 6. It should be noted that the embodiment shown in these Figures has to be understood to be very general and to designate any kind of contact connection on a semiconductor device, whether it is a contact with the substrate or with a doped region carried by the substrate or with a layer of polycrystalline material. FIG. 2 shows diagrammatically and in a simplified form a contact island 20 disposed in a contact zone 18 limited at the surface of a semiconductor substrate 10 by means of a dielectric layer 19.

The contact island 20 is obtained in a manner so as to be self-aligned with the contact zone 18 by depositing a layer of a refractory metal, such as titanium, on the whole structure, and then by a suitable thermal treatment to cause the titanium layer to react locally with the silicon surface portions which are not covered by the electric layer 19 and to form a titanium silicide at the area of the contact zones 18, and finally by removing by selective etching the remaining part of the titanium layer which has not reacted. It is known and practically necessary at this stage of the method to stabilize the composition of the layer of titanium silicide in contact with the material of the contact zone by a second thermal treatment carried out preferably in a nitrogen atmosphere. Therefore, the contact island 20 is ultimately composed of a layer of titanium silicide 201 on which is disposed a thin layer of titanium nitride 202 obtained during the aforementioned treatment by the action of nitrogen on titanium silicide.

By way of example, a treatment for 10 seconds at 850° C. under nitrogen results in the formation of a layer of titanium nitride 202 having a thickness of 6 to 8 nm at the surface of a layer of titanium silicide 201 having a thickness of the order of 30 nm.

Subsequently, a selective growth of tungsten takes place in order to cover the contact islands 20 by a complementary metallic layer which is comparatively thin.

Figure 3:
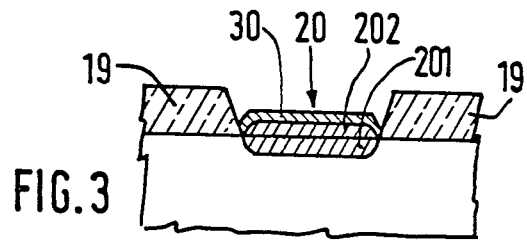

During this operation, the layer of titanium nitride 202 serves as a nucleation base for the growth of tungsten, whereas the dielectric layer 19 inhibits this growth. Thus, the complementary metallic layer 30 is located at the contact islands 20, as shown in FIG. 3, without it being necessary to carry out a photomasking operation. The method of selectively growing tungsten is known per se. It preferably utilizes the method of deposition from the vapour phase using the chemical reaction of reduction of tungsten fluoride ($WF_6$) by hydrogen ($H_2$) at a temperature lying between 300° C. and 500° C. and at a reduced pressure of the order of 0.05 to 2 torr (6.6 to 266 Pa). The gas flowrates of $WF_6$ and $H_2$ introduced during the reaction are chosen in a ratio lying between 1/1000 and 1/5.

The complementary metallic layer 30 may further be formed, if desired, by selective growth of molybdenum in operating conditions very close to those indicated for tungsten. During the indicated reaction of reduction of tungsten hexafluoride or molybdenum hexafluoride by hydrogen, the layer of titanium silicide 201 would be attacked if it were not protected by a layer of titanium nitride 202. However, this protection is no longer indispensable and the layer of titanium nitride 202 could be omitted in a variation of the method of chemical deposition from the vapour phase, according to which the reduction of hexafluoride is completed by the introduction into the reaction gases of a flow-rate of silane ($SiH_4$) having a sufficiently low value as compared with the flow-rate of hexafluoride in order that the selectivity of growth is maintained.

When the ratio between the flow-rate of silane and the flow-rate of hexafluoride used is chosen in the range of from 1/5 to 3/1, a ratio of the order of 1/1 being particularly favourable, the selectivity of the deposition is maintained satisfactorily; the attack of titanium silicide (or silicon) is avoided, while the incorporation of silicon in the deposited metal remains so small that it can be measured only with difficulty and can be considered to be zero in practice.

Although actually the thickness of the complementary metallic layer 30 is not particularly critical, it is generally chosen to lie between 20 and 150 nm and preferably between 50 and 100 nm.

Above a thickness of 150 nm, an undesired relief of topography is introduced at the surface of the device and the duration of the etching operation is ineffectively prolonged. Below a thickness of 20 nm, the complementary metallic layer 30 no longer completely fulfills its function of etch stopper and can exhibit discontinuities resulting from the initial phase of growth.

Figure 4:
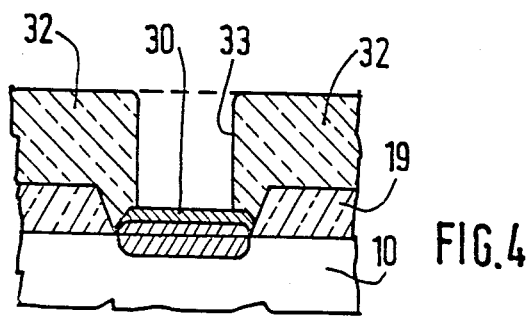

As shown in FIG. 4, an isolating layer 32 of, for example, silicon dioxide is then formed on the whole structure by using any suitable method, for example, the method of deposition from the vapour phase utilizing the oxidation of a silicon compound.

It may be advantageous at this state of the process to cause the isolating layer 32 to be subjected to a so-called planarization operation, which has for its object to render its outer surface practically flat, while the isolating layer bears on a structure having a pronounced relief.

By means of a photomasking operation, contact openings 33 are etched into the isolating layer 32 by preferably using the so-called reactive ion etching technique, which is able to produce openings of very small diameter having practically vertical walls. The area of the contact openings 33 is such that these openings expose a surface part of the complementary metallic layer 30 covering the contact islands. For the ion etching treatment of the isolating layer 32 use is preferably made of the ionized gas mixture $CF_4+O_2$ as a chemical attacking medium.

In this process, the etching selectivity of silicon oxide with respect to tungsten or molybdenum exceeds a ratio of 30/1 so that the complementary metallic layer 30 constitutes very effective etch stopper.

In the method according to the prior art, the step of etching the isolating layer 32 is terminated on a contact island formed by a double layer of titanium nitride-titanium silicide. The etching selectivity of silicon oxide with respect to these materials only has a ratio close to 10/1. The method according to the invention therefore permits terminating the step of etching the contact openings 33 without the risk of excessive under-etching and of degradation of the titanium silicide. This advantage is of particular importance when on the same substrate contact openings having different depths have to be etched simultaneously, as shown in FIG. 1 for the contact openings 23 and 25. The mask of photoresist having served to define the contact openings 33 (not shown in the Figure) is eliminated, for example, by means of an oxygen plasma etching step.

The structure at the stage shown in FIG. 4 is then subjected to a complementary operation of cleaning its surface utilizing the chemical baths usual in the art, such as, for example, a curing in nitric acid and then in diluted hydrofluoric acid followed by a careful rinsing in de-ionized water and by a drying by centrifuging.

The following operation has for its object to fill at least for a substantial part of their volume the contact openings 33 by localized elements of a refractory metal, such as tungsten or molybdenum.

Figure 5A:
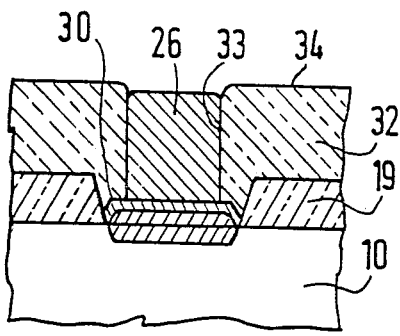

Localized elements 26 as shown in FIG. 5A can be obtained by a method of selectively growing tungsten or molybdenum in operating conditions which are substantially the same as for the formation of the complementary metallic layer 30.

Preferably, the same metal, for example tungsten, will be used for forming the complementary metallic layer 30 and the localized elements 26 especially for reasons of simplicity and economy of equipment.

However, this is not indispensable and the complementary metallic layer 30 could also be made of molybdenum and localized elements 26 of tungsten could then be grown, or, if desired, conversely, as a function of particular conditions. In all cases, the metallic surface of the complementary layer 30, which is exposed through the contact openings 33, serves as a nucleation base for the selective growth of the localized elements 26, while the growth does not occur on the free surface 34 of the isolating layer 32.

In a typical application of large scale integration circuits, the contact openings 33 have a diameter of 0.8/μ and a depth which can vary from 0.5 to 0.9/μ as a function of the position of said openings.

The duration of the growth is determined so that the contact openings of smallest depth are filled in excess and have localized elements 26 whose upper level forms an excrescence slightly exceeding the level of the adjacent isolating layer and widening laterally, but without this being detrimental to the operation of the device.

The case of such a contact opening filled in excess is shown in FIG. 1 for the contact opening 25. On the contrary, the deepest contact openings are not completely filled during the same deposition by the localized elements 26, as shown, for the contact openings 23 and 24 of FIG. 1.

This does not involve a great disadvantage because the non-filled part of such a contact opening has an aspect ratio (depth/diameter) which is now much lower than than 1, while its subsequent filling by means of conventional metallization techniques can readily be obtained.

The formation of the localized elements 26 is obtained directly and economically by the method of selective growth just mentioned. However, this is not essential to the invention, which is essentially based on the coverage of the contact islands by a complementary layer 30 of tungsten or molybdenum.

The localized elements 26 can further be obtained indirectly, for example by means of a process which will be described with reference to FIGS. 5B and 5C.

Figure 5B:
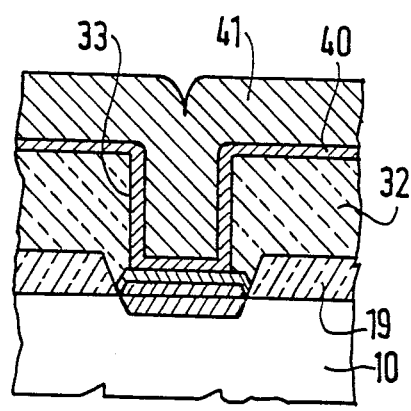

As shown in FIG. 5B, an adhesive layer 40, which is thin with respect to the dimensions of the contact openings, for example 100 nm of an alloy of titanium-tungsten (10% by weight of Ti, 90% by weight of W), is deposited on the whole surface, inclusive of the inner surface of the contact openings 33.

It is important to use for this purpose a deposition method, such as the cathode sputtering method, which ensures that a conformal covering of the surface is obtained, independently of its relief, whose thickness is substantially constant even inside the contact openings.

Subsequently, a filling layer 41 of tungsten is caused to grow on the adhesive layer 40 utilizing also a deposition method having conformal covering properties, such as the method of deposition from the vapour phase at reduced pressure. The thickness of the filling layer 41 is chosen in this case to be sufficient to fill entirely the contact openings 33, that is to say that it has a value which is at least equal to half the diameter of the openings.

Figure 5C:
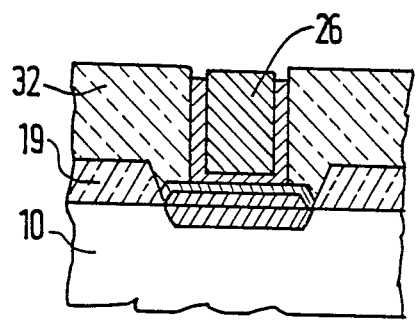

The adhesive layer and the filling layer are then eliminated from the surface of the isolating layer 32 in order that only the portions of these layers situated inside the contact openings 33 and thus constituting localized metallic elements 26 subsist, as shown in FIG. 5C. This operation can be carried out by etching in an $SF_6$ plasma, which attacks more rapidly the tungsten and the titanium-tungsten alloy than the silicon oxide.

Figure 6:
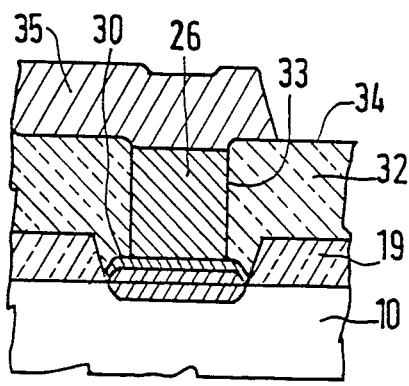

The localized element 26 constitutes a part of a metallic configuration of interconnections. As shown in FIG. 6, the other complementary part is formed by covering the surface 34 of the device by a metallic layer 35, whose portions other than those of the desired configuration are eliminated by selective etching localized, for example, by means by a pnotoresist mask.

The surface 34, which bears the metallic layer 35 has preferably been rendered substantially flat so that this metallic layer 35 can be obtained without difficulty utilizing usual techniques. Numerous metals are suitable for carrying out this operation and the choice is guided by the requirements of mechanical adhesion to the surface of the isolating layer 32 and by the attempt to obtain a minimum of electrical conductivity and a high resistance to the electromigration phenomenon. By way of example, a layer of aluminium or of an alloy of aluminium-copper having a thickness of 0.8 to 2 /μ is particularly suitable. Of course, parts of the metallic layer 35 cover the contact openings 33 in order to ensure that therein the electrical connection with the localized elements 26 is established.

Although this has not been shown in the Figures, the device may be completed, if desired, and as a function of its complexity by at least one supplementary metallic configuration of interconnections formed at a higher level.

The method according to the invention is not limited to the manufacture of a structure of interconnections on an integrated circuit comprising MOS transistors, It generally serves to form the contact connection of any kind of semiconductor devices having a silicon substrate and preferably when contact zones of very small dimensions should be used and when contact islands of a refractory metal silicide should be provided thereon, which are self-aligned with the contact zones.

What is claimed is:

1. A method of manufacturing a structure of electrical interconnections on a semiconductor device having a silicon substrate, this method comprising especially the following successive steps:
   producing contact zones at the surface of the semiconductor device,
   forming contact islands comprising at least one layer of silicide of a refractory metal, such as titanium or cobalt, covering the contact zones,
   forming on the assembly an isolating layer, in which contact openings are provided, in which at least parts of the surface of said contact islands are exposed,
   obtaining a metallic configuration of interconnections by first carrying out a step of at least partially filling the contact openings by localized elements of a refractory metal, such as tungsten or molybdenum, and by then covering the assembly with a metallic layer, which is then cut into a given configuration, parts of this metallic configuration covering the contact openings and being in electrical contact with said localized elements,
characterized in that, before the isolating layer is formed, the contact islands are covered by a complementary metallic layer obtained by selective growth of tungsten or molybdenum, which is localized at said islands.

2. A method as claimed in claim 1, characterized in that the thickness of said complementary metallic layer is chosen to lie between 20 and 150 nm and preferably between 50 and 100 nm.

3. A method as claimed in any one of claims 1 or 2, characterized in that, having chosen titanium as refractory metal for the formation of said layer of silicide, at its surface a layer of titanium nitride is formed which is used as a base for the selective growth of the complementary metallic layer.

4. A method as claimed in claim 3, characterized in that said layer of titanium nitride is formed by a conversion treatment at the surface of the layer of titanium silicide at a temperature lying between 700 and 1000° C. in a nitrogen atmosphere.

5. A method as claimed in claim 1 or 2, characterized in that the complementary metallic layer is formed by the method of chemical deposition from the vapour phase at a reduced pressure lying between 0.05 and 2 torr (6.6 to 266 Pa) utilizing the reduction by hydrogen of tungsten hexafluoride (or molybdenum hexafluoride) at a temperature lying between 300 and 500° C. and a gas flow-rate ratio of hexafluoride/hydrogen lying between 1/1000 and 1/5.

6. A method as claimed in claim 5, characterized in that moreover into the reaction gases of the aforementioned chemical deposition is introduced a flow-rate of silane, of which the quantity with respect to the flow-rate of hexafluoride has a ratio chosen to lie between 1/5 and 3/1.

* * * * *